United States Patent
Yun et al.

(10) Patent No.: US 9,774,384 B2
(45) Date of Patent: Sep. 26, 2017

(54) MULTI-BEAM ANTENNA SYSTEM AND METHOD FOR CONTROLLING OUTPUT POWER THEREOF

(71) Applicant: Electronics and Telecommunications Research Institute, Daejeon (KR)

(72) Inventors: So-Hyeun Yun, Daejeon (KR);
Man-Seok Uhm, Daejeon (KR);
Hong-Yeol Lee, Cheongju-si (KR);
Chang-Soo Kwak, Daejeon (KR);
In-Bok Yom, Daejoen (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 606 days.

(21) Appl. No.: 14/301,776

(22) Filed: Jun. 11, 2014

(65) Prior Publication Data

US 2015/0009069 A1    Jan. 8, 2015

(30) Foreign Application Priority Data

Jul. 5, 2013  (KR) .......................... 10-2013-0079069

(51) Int. Cl.
*H04B 7/185* (2006.01)
*H01Q 3/36* (2006.01)
(Continued)

(52) U.S. Cl.
CPC ........... *H04B 7/18515* (2013.01); *H01Q 3/36* (2013.01); *H01Q 25/007* (2013.01); *H03F 3/68* (2013.01); *H04B 7/0426* (2013.01)

(58) Field of Classification Search
CPC  H04B 7/18515; H04B 7/0408; H04B 7/0426; H04B 7/043; H03F 3/68; H01Q 3/26; H01Q 3/2658; H01Q 3/40
(Continued)

(56) References Cited

U.S. PATENT DOCUMENTS 4,907,004 A  *  3/1990  Zacharatos ............. H01Q 3/40
                                                        342/354
5,115,248 A     5/1992  Roederer
(Continued)

OTHER PUBLICATIONS

Angeletti et al. "Multiport Power Amplifiers for Flexible Satellite Antennas and Payloads." Mircowave Journal, May 1, 2010, pp. 1-11.*
(Continued)

*Primary Examiner* — Gregory C Issing
(74) *Attorney, Agent, or Firm* — William Park & Associates Ltd.

(57) ABSTRACT

Disclosed are a multi-beam antenna system and a method of controlling an output power thereof. An embodiment of the present invention includes a beam forming network configured to receive a plurality of signals to be a plurality of beams, to divide each of the plurality of signals to a plurality of divided signals, and to output a plurality of excited signals by adjusting and combining amplitude and phase of each of the plurality of divided signals, an MPA set having a plurality of MPAs configured to receive corresponding excited signals among the plurality of excited signals from the beam forming network and to control output powers of the received excited signals according to communication traffic, and a feed array having a plurality of feeds configured to form a multi-beam by being excited according to the amplitude and phase of the excited signals from the MPA set.

10 Claims, 9 Drawing Sheets

(51) Int. Cl.
*H03F 3/68* (2006.01)
*H04B 7/0426* (2017.01)
*H01Q 25/00* (2006.01)

(58) Field of Classification Search
USPC .................................................. 342/354, 373
See application file for complete search history.

(56) References Cited

U.S. PATENT DOCUMENTS

| | | | | |
|---|---|---|---|---|
| 5,734,349 | A * | 3/1998 | Lenormand | H01Q 25/007 342/371 |
| 5,929,804 | A * | 7/1999 | Jones | H01Q 3/40 342/354 |
| 5,936,592 | A * | 8/1999 | Ramanujam | H01Q 3/2605 342/373 |
| 7,710,340 | B2 * | 5/2010 | Rao | H01Q 19/10 343/778 |
| 8,494,445 | B2 * | 7/2013 | Miller | H04B 7/18515 342/373 |

OTHER PUBLICATIONS

Suzuki et al. "Multibeam Phased Array Feed System Using Beam Group Concept." NTT Technical Review, vol. 5, No. 1 Jan. 2007. pp. 61-69.*

Shunichiro Egami et al., "An Adaptive Multiple Beam System Concept," IEEE Journal on Selected Areas in Communication, May 1987, 630-636, vol. SAC-5, No. 4.

Piero Gabellini et al., "Flexible Payload Architecture for Multiple Shaped-Beam Coverage From a S-DMB Geostationary Satellite System," Antenna and Propagation, EuCAP, Nov. 2006, pp. 1-6, vol. 1.

Manuel Sanchez et al., "Reconfigurable High-Power S-Band Semi-Active Multimatrix Antenna for European Coverage," 2nd ESA Workshop on Advanced Flexible Telecom Payloads, pp. 1-8, vol. 1.

* cited by examiner

MULTI-BEAM ANTENNA SYSTEM AND METHOD FOR CONTROLLING OUTPUT POWER THEREOF

BACKGROUND

1. Technical Field

The present invention relates to a multi-beam antenna system and a method for controlling an output power thereof, especially to a multi-beam antenna system and a method for controlling an output power thereof that can control a strength of a beam by controlling an output power without recomposing a form of the beam.

2. Background Art

A beam-forming technology is currently used by many kinds of communication systems to avoid wasting of resources, and the beam-forming technology is realized by utilizing a multi-beam antenna system. Although multi-beams can be realized easily as an SFPB (Single Feed per Beam) system, in which each of feeds forms an individual single beam, its performances are not suitable enough for long distance communication due to a low gain. While a system having a multi-beam service coverage by having a plurality of feeds overlapped with one another can improve the directivity and gain of the beam greatly, it is difficult to recompose the beam in accordance with a change of situations. A phase array antenna is suitable to enforce the function of recomposing the beam. The phase array antenna for forming a multi-beam antenna uses a plurality of feeds for making a single beam, and a one feed may be involved in forming a plurality of beams due to overlapped beams. Making a beam with the phase array antenna requires an optimization process because a suitable amplitude and phase of a signal need to be excited to a feed. There are three methods of optimizing an excitation coefficient: optimizing both an amplitude and a phase (Amplitude & Phase Optimization: A&P), optimizing a phase only (Phase Optimization: PO), and optimizing an amplitude only (Amplitude Optimization: AO).

The latest phase array antenna system includes a beam-forming network (BFN hereinafter), a Multi-Port Amplifier (MPA hereinafter), and a feed array. The BFN, which is a beam creation portion creating a beam, optimizes an amplitude and phase of an excitation signal by including a variable attenuator and a variable phase shifter. The MPA controls an output power according to communication traffic of a service coverage formed by a plurality of means. The MPA is located between the BFN and the feed array, and includes an input matrix, a high power amplifier, and an output matrix. An output signal from the BFN is inputted to the input matrix of the MPA, and then the excited signal of which output is amplified by the high power amplifier in MPA is excited to a feed of the feed array. The MPA is published in "An adaptive multiple beam system concept" (S. Egami, M, Kawai, IEEE Journal on Selected Areas in Communication, Vol. SAC-5, No. 4, May 1987).

FIG. 1 shows an example of a conventional phase array antenna system.

The conventional phase array antenna system of FIG. 1 is the conventional phase array antenna system disclosed in U.S. Pat. No. 5,115,248 "Multi-beam antenna feed device" and includes a plurality of BFNs 100, an MPA 200, and a feed array 300. The BFN 100 of FIG. 1 includes a divider 101, a variable phase shifting portion 102, and a combiner 104. Moreover, the MPA 200 has an input matrix 202, a high power amplifier 203, and an output matrix 204.

The plurality of BFNs 100 of the phase array antenna system of FIG. 1 are provided in correspondence with the number of signals (B1~BNb), each of which is outputted as a beam, and then each divider 101 of the plurality of BFNs 100 divides the corresponding input signals among the plurality of input signals (B1~BNb) by the number (Ne) of the feeds, and then the combiner 104 receives and combines the signals divided by Ne number and phase-adjusted by the Ne number of the variable phase shifters, and transfers the signals to the MPA 200 as excited signals. Since the phase array antenna system of FIG. 1 has the variable phase shifting portion 102 but does not have a variable attenuator, it is possible that a multi-beam is formed with phase optimization (PO) only. The MPA 200 re-divides the excited signals inputted from the plurality of BFNs 100 in accordance with a signal amplification degree at the input matrix 202, and transfers them to corresponding high power amplifiers among the high power amplifiers 203. Then, the output matrix 204 receives the amplified excited signal inputted from each of the high power amplifiers 203 and inputs the amplified excited signal to a corresponding feed among a plurality of feeds 301, thereby exciting the corresponding feed.

The phase optimization (PO) can reduce the number of kinds of amplifiers and improve power usage efficiency because the output of the high power amplifier 203 does not need to be modified although an antenna gain is reduced. On the contrary, amplitude & phase optimization (A&P) takes advantage of optimizing of the antenna gain, but because of low power usage efficiency and high DC power consumption, the phase optimization (PO) is largely used to optimize an array antenna. Here, as many variable phase shifting portions 102 as the number of beams (Nb) multiplied by the number of total feeds (Ne) are required in order to form a perfectly recomposed beam for each beam. However, the phase array antenna system of FIG. 1 has a limitation in optimizing the antenna gain because it uses only the variable phase shifting portion 102 without the variable attenuator.

Moreover, it is difficult to realize and costly to produce the phase array antenna system of FIG. 1 because the phase array antenna system of FIG. 1 needs to have as many BFNs 100 as the number of beams (number of signals), a plurality of the variable phase shifting portions 102 are required despite much freedom in forming a beam as each BFN 100 divides and combines as many input signals as the number of feeds, and the number of ports for the divider 101 and combiner 104 are increased.

Meanwhile, a tradeoff between antenna gain optimization and power efficiency is described in "Flexible payload architecture for multi-beam shaped-beam coverage from a S-DMB Geostationary satellite system" (Piero G., Nicola G., and Piero A., Antenna and Propagation, EuCAP, November, 2006, pp. 1-6). The thesis shows the phase optimization (PO) has a minimum EOC (Edge of Coverage) gain degraded by 0.5~1.8 dB, compared to the amplitude & phase optimization (A&P) by use of a reflector operating in S band (2 GHz~4 GHz) and feed array. However, choosing the phase optimization (PO) is suggested because it is more efficient considering a saturated power of the high power amplifier 203 and DC power consumption even though the EOC gain is degraded. Thus, generally taken for a multi-beam antenna system controlling an output power of a satellite is the phase optimization (PO), which controls only a phase of an excited signal in order to make operational points of the high power amplifier 203 in the MPA200 identical.

FIG. 2 shows a beam pattern and an EOC gain in accordance with amplitude & phase optimization (A&P) and phase optimization (PO).

In FIG. 2, a reflector and a feed operating at Ka band (20~30 GHz) are used, and (a) shows a case where amplitude & phase optimization (A&P) is applied and (b) shows a case where phase optimization (PO) is applied. Moreover, the dotted lines in (a) and (b) of FIG. 2 indicate a coverage where a communication service is required, and the solid lines indicate an outline of minimum EOC gain by optimization. As illustrated in FIG. 2, in the Ka band, beam patterns used in the phase optimization (PO) are degraded, compared to the amplitude & phase optimization (A&P), by radiating a beam to an unnecessary area, and the minimum gain was lowered by 0.5 dB~1.4 dB. Although the gain for the Ka band is illustrated in FIG. 2, it is known that the amplitude & phase optimization (A&P) can improve the antenna minimum EOC gain by about 1 dB, compared to the phase optimization (PO), regardless of a frequency. However, as described above, the phase optimization (PO) is largely used even though the EOC gain is degraded by the problems of power usage efficiency and DC power consumption.

SUMMARY

The present invention provides a multi-beam antenna system composing a beam by optimizing an antenna gain with amplitude & phase optimization (A&P), being able to reduce the number of variable phase shifters and variable attenuators by adjusting an output power of each beam without recomposing a beam form by phase optimization technique, utilizing resources efficiently, and optimizing performances.

The present invention also provides a method for controlling an output power of the multi-beam antenna system.

An aspect of the present invention provides a multi-beam antenna system, which includes: a beam forming network configured to receive a plurality of signals to be a plurality of beams, to divide each of the plurality of signals to a plurality of divided signals, and to output a plurality of excited signals by adjusting and combining amplitude and phase of each of the plurality of divided signals; an MPA set having a plurality of MPAs configured to receive corresponding excited signals among the plurality of excited signals from the beam forming network and to control output powers of the received excited signals according to communication traffic; and a feed array having a plurality of feeds configured to form a multi-beam by being excited according to the amplitude and phase of the excited signals from the MPA set.

The beam-forming network includes: a plurality of dividers provided in a quantity corresponding to the number of the plurality of beams, wherein each divider is configured to receive corresponding input signal among the plurality of input signals and to divide the input signal in accordance with the number of Nc feeds required for forming a single beam; a plurality of variable attenuators configured to receive corresponding divided signals among the plurality of divided signals from the plurality of dividers and to adjust an amplitude of the divided signals; a plurality of variable phase shifters provided in a quantity corresponding to the number of the plurality of variable attenuators and configured to adjust phases of the amplitude-adjusted signals from corresponding variable attenuators among the plurality of variable attenuators; and a plurality of combiners provided in a quantity corresponding to the number of the plurality of feeds and configured to receive and combine the number Nw of amplitude and phase adjusted signals among the plurality of amplitude and phase adjusted signals from the plurality of variable phase shifters and to output the excited signals, wherein Nw is the number of beams that one feed can contribute to beam-forming.

The beam forming network has the number Nb of dividers, wherein the beam forming network comprises the plurality of variable attenuators and the plurality of variable phase shifter provided in quantity of Nb*Nc, wherein Nb is the number of the input signals and Nc is the number of the feeds required for forming a single beam.

The MPA set has the plurality of MPAs, which have an N number of input ports and an N number of output ports, wherein the number of the plurality of MPAs is the greater of Nc and Ne/N, wherein Nc is the number of the feeds required for forming a single beam and Ne is the number of feeds.

The MPA set is configured to obtain at least one connection between the output ports of the plurality of MPAs and the plurality of feeds according to amplitude & phase optimization (A&P) in a normal condition not requiring a boosted beam.

In the connection of the plurality of MPAs and the plurality of feeds, the feeds selected for forming a single beam are each connected with different MPAs among the plurality of MPAs so that frequencies of the output ports of the plurality of MPAs are orthogonal with each other.

In the connection of the plurality of MPAs and the plurality of feeds, output power of each of the plurality of MPAs is configured to be within a predetermined power deviation.

In a boost condition, the MPA set is configured to identify a boost level and a beam which needs to be boosted among the plurality of beams, to compute a boost MPA power for each of the plurality of MPAs required for boosting the beam to the boost level, and to control the output powers of the plurality of MPAs according to amplitude optimization (AO) if the computed boost MPA power does not exceed an MPA power limit.

The MPA set is configured to determine whether an EOC (Edge Of Coverage) gain generated by output powers of the plurality of MPAs controlled according to the amplitude optimization (AO) satisfies a required EOC gain, and to increase the EOC gain by applying phase optimization (PO) if the required EOC gain is not satisfied.

The MPA set is configured to connect the output ports of the plurality of MPAs and the plurality of feeds through a different connection if the computed boost MPA power exceeds the MPA power limit in the boost condition, and then to control the output powers of the plurality of MPAs according to the amplitude optimization (AO).

Another aspect of the present invention provides a method for controlling an output power for a phase array antenna system including a beam forming network having a plurality of dividers, a plurality of variable attenuators, a plurality of variable phase shifters, and a plurality of combiners therein, an MPA set having a plurality of MPAs therein, and a feed array having a plurality of feeds therein, the method includes: designing a beam in which feeds are selected in order for each EOC (Edge Of Coverage) gain of a plurality of beams to be maximized in accordance with amplitude & phase optimization (A&P) in a normal condition and in which a power required for the selected feeds is computed; optimizing a connection between the plurality of MPAs and the plurality of feeds based on the power required for the selected feeds; and controlling output powers of the plurality of MPAs through designing the boosted beam among the plurality of beams in accordance with amplitude optimization (AO) in a boost condition requiring the boosted beam.

The designing of a beam includes: analyzing an antenna configuration; selecting feeds contributing to forming each beam among the plurality of feeds in order for each EOC gain of beams analyzed by using amplitude & phase optimization (A&P) to be maximized; computing a required power for each of the plurality of beams; and computing a required power for each of feeds selected to be corresponded to each of the plurality of beams.

The optimizing of a connection includes: analyzing all combinations of possible connections between the output ports of each of the plurality of MPAs having N number of input ports and N number of output ports and the plurality of feeds; obtaining a combination in which frequencies of the output ports of each of the plurality of MPAs are orthogonal to each other among all analyzed combinations; determining whether an output power of each of the plurality of MPAs in the obtained combination is within a predetermined power deviation; and connecting the output ports of each of the plurality of MPAs and the plurality of feeds through selecting a combination in which the output power of each of the plurality of MPAs is determined to be within an MPA power limit.

The controlling of an output powers of the plurality of MPAs includes: determining a beam to be boosted among the plurality of beams and a boost level of the beam to be boosted; computing a boost MPA power required for a corresponding MPA in order to boost the beam for the boost level; determining whether the computed boost MPA power exceeds an MPA power limit; and boosting a beam by controlling the corresponding MPA power by using amplitude optimization (AO) if the computed boost MPA power does not exceed the MPA power limit.

In the boosting of a beam by controlling the corresponding MPA power, excitation coefficients are not changed in order to maintain patterns and performances of the plurality of beams.

The controlling of output powers of the plurality of MPAs further includes: re-computing the EOC gain of the boosted beam after the boosting of a beam; determining whether the EOC gain of the boosted beam is greater than a required EOC gain; and controlling the MPA power by additionally applying phase optimization (PO) if the EOC gain of the boosted beam is less than the required EOC gain.

The controlling of output powers of the plurality of MPAs further includes: connecting output ports of a plurality of MPAs and the plurality of feeds through a different combination among the obtained combinations if the computed boost MPA power exceeds an MPA power limit; and re-controlling output powers of the plurality of MPAs in accordance with the amplitude optimization (AO).

Accordingly, the multi-beam antenna system and the method for controlling output power thereof according to the present invention can boost a beam in a certain service coverage by increasing an output power level without reconfiguring the form of beam. That is, since the numbers of variable phase converters and variable attenuators can be reduced as the form reconfiguration of beam is not needed, it becomes easier to realize and less costly to develop the system due to the simplified system. In addition, by setting the number of MPA to be equal to or greater than the number of feeds involved in forming a single beam, the frequency directivity of the MPA output port can be achieved, and by limiting the power of MPA within a margin of error to combine with feeds, antenna performance optimization as well as effective usage of resources can be achieved at the same time. Therefore, even with a high power amplifier having a relatively-low output, it is possible to form a boost beam without a decrease in performance and resource wastes.

DETAILED DESCRIPTION

Figure 1:
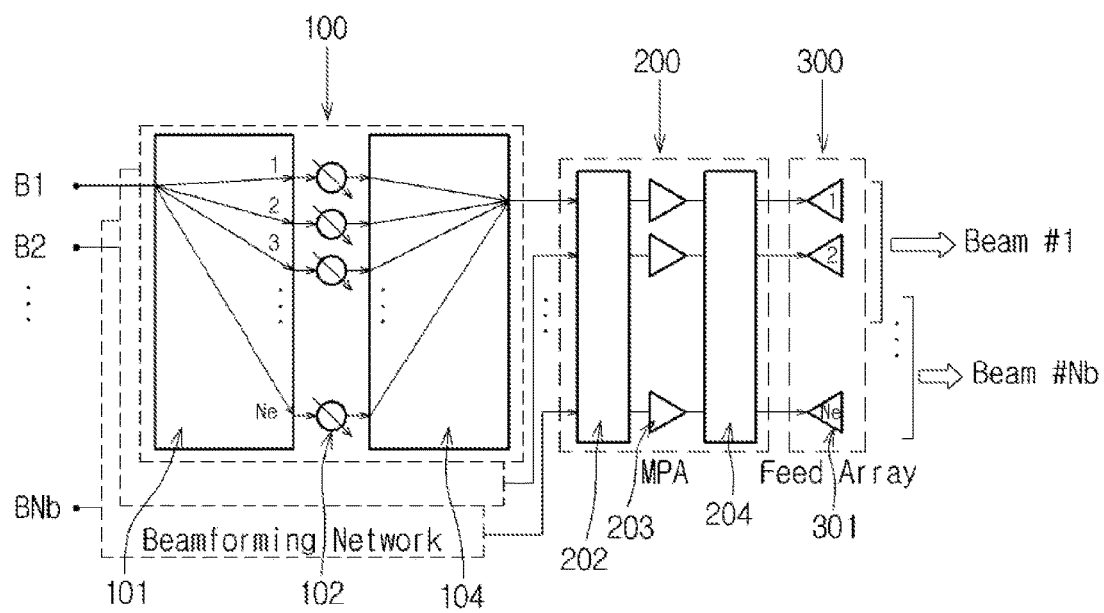
FIG. 1 shows an example of a conventional phase array antenna system.

The appended drawings and the descriptions on the drawings illustrating an embodiment of the present invention shall be referred to in order to understand the present invention, operational advantages of the present invention, and objects obtained by embodying the present invention.

Hereinafter, certain embodiments of the present invention will be described in detail with reference to the appended drawings. However, the present invention can be realized in various forms and shall not be limited to the described embodiments. For a clear description of the present invention, any portions irrelevant to the description will be omitted, and it shall be appreciated that same reference symbols in the drawings represent same elements.

When it is described that a certain portion "includes" a certain component, it does not mean to exclude other components but means to include other components unless otherwise described. In addition, the terms "portion", "device", "module", "block," etc. mean a unit for processing at least one of functions or operations, so they can be realized in hardware, software, or a combination thereof.

Figure 3:
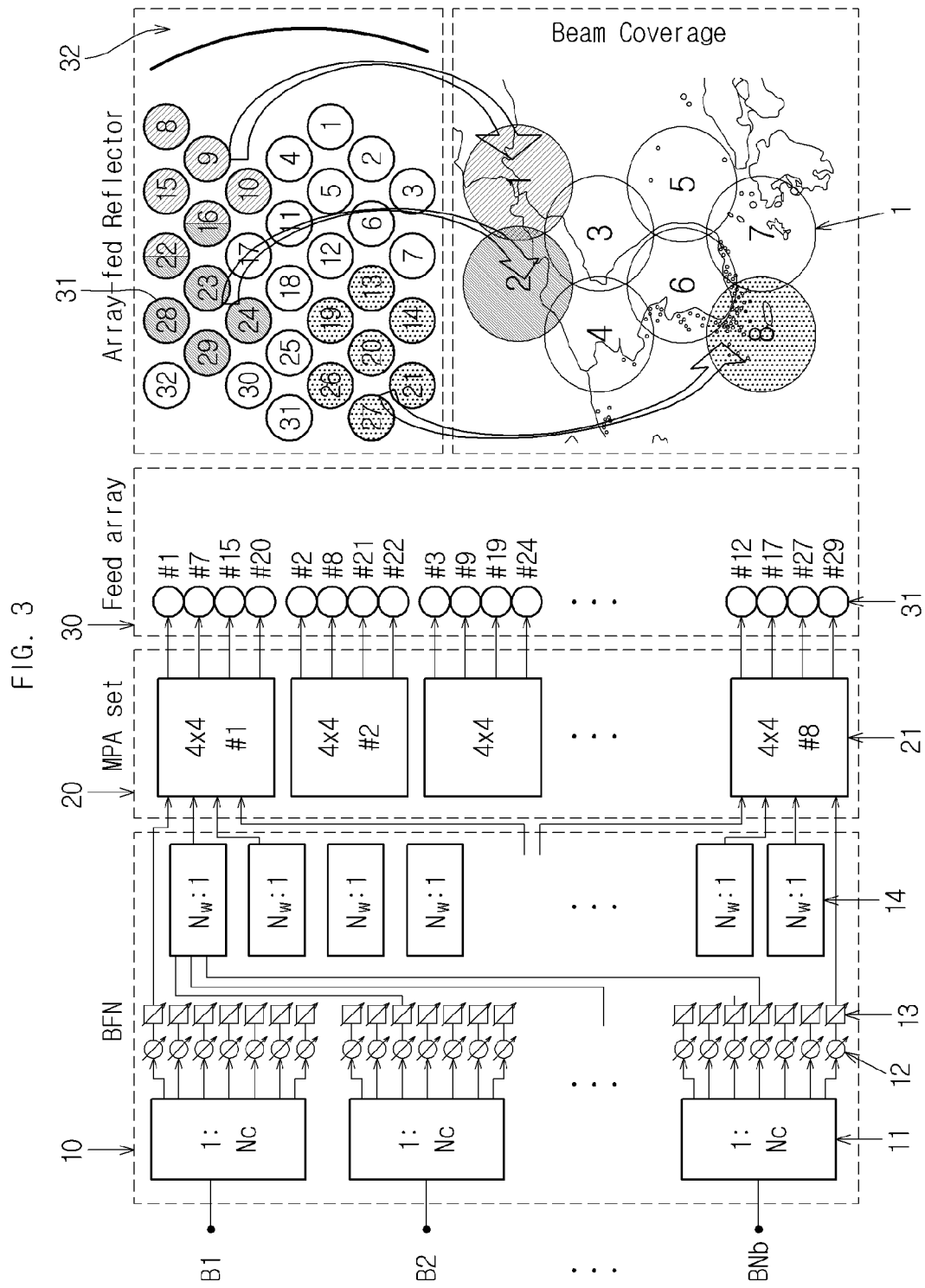
FIG. 3 shows a phase array antenna system in accordance with an embodiment of the present invention.

FIG. 3 shows a phase array antenna system in accordance with an embodiment of the present invention.

Figure 2:
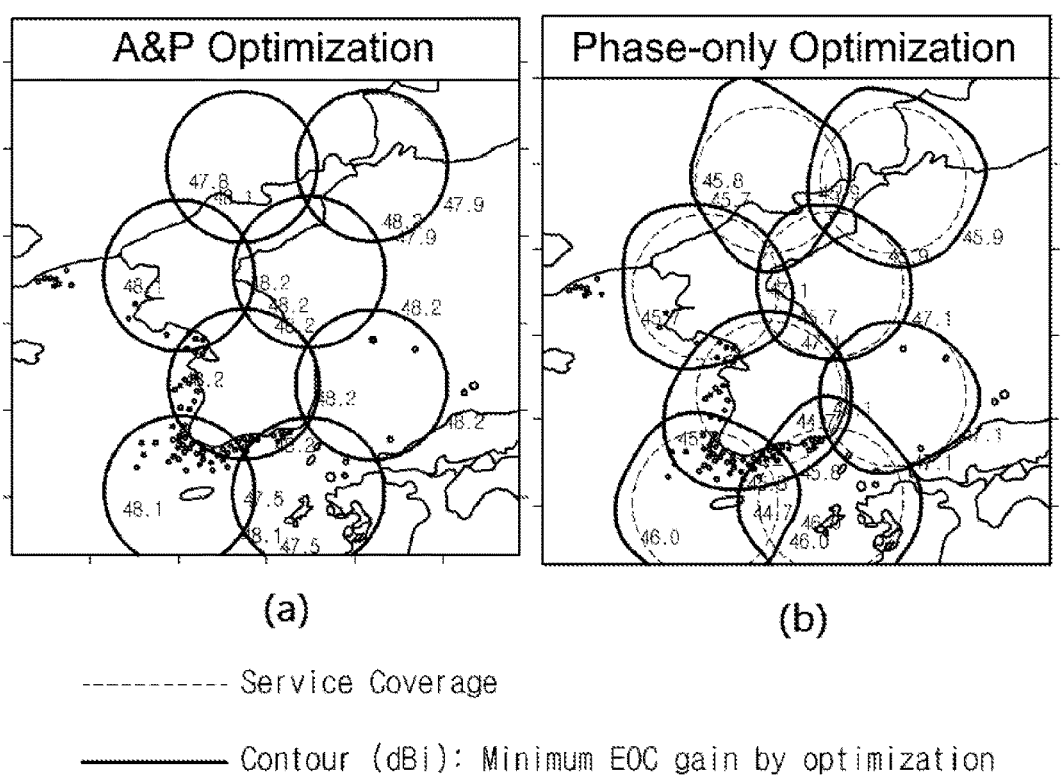
FIG. 2 shows a beam pattern and an EOC gain in accordance with an amplitude & phase optimization (A&P) and phase optimization (PO).

The phase array antenna system shown in FIG. 3 includes a BFN 10, an MPA set 20, and a feed array 30, like the phase array antenna system shown in FIG. 2.

Unlike FIG. 1, the phase array antenna system shown in FIG. 3 has a single BFN 10, to which a plurality of signals B1~BNb are inputted, instead of having BFNs 100 for each of the signals. The BFN 10 that receives the plurality of signals B1~B8 to form beams includes a plurality of dividers 11, a plurality of variable attenuators 12, a plurality of variable phase shifters 13, and a plurality of combiners 14. Here, the plurality of signals B1~B8 have information about an amplitude and phase of beams to be outputted. The plurality of dividers 11 are provided with as many as the number Nb of beams that the phase array antenna system will output, and receive and divide each of the signals B1~B8 to the plurality of variable attenuators 12. Here, each of the plurality of dividers 11 divides the signals in correspondence with the number Nc of feeds that are required for forming a single beam. That is, each of the plurality of dividers 11 performs 1:Nc distribution. In one embodiment, the number Nc of feeds required for forming a single beam is assumed to be seven. Moreover, the number Nb of beams is assumed to be eight. Accordingly, there are eight dividers 11 provided in FIG. 3.

The plurality of variable attenuators 12 receive the signals that are divided by the corresponding divider 11 and adjust a gain for the signals to have a proper level of power, and the number of the plurality of variable attenuators 12 is equal to the number Nc of feeds required for forming a single beam. Since the number of the plurality of dividers 11 corresponds to the number Nb of beams, the total number of the plurality of variable attenuators 12 is equal to Nb*Nc. The plurality of variable phase shifters 13 correspond with the plurality of variable attenuators 12, respectively, and each receive a gain-adjusted signal from the corresponding variable attenuator 12 and shift a phase of the gain-adjusted signal. Therefore, the number of variable phase shifters 13 is also equal to Nb*Nc. The plurality of combiners 14 receive the phase-adjusted signals from the corresponding variable phase shifters among the plurality of variable phase shifters 13, combine the phase-adjusted signals, and transfer the combined signal to the MPA set 20. The plurality of combiners 14 can be provided according to the number Ne of feeds 31, and can be provided in the number Ne of feeds 31 or less (Ne−2 in FIG. 3). The number of the plurality of combiners 14 can be equal to the number Ne of feeds, but as illustrated in FIG. 3, the number of the plurality of combiners 14 can be less than the number Ne of feeds 31 when some of phase-adjusted signals are transferred directly to the MPA set 20. As each of the plurality of combiners 14 receives the number Nw of phase-adjusted signals that contribute to forming a single beam from the corresponding variable phase shifters 13 and outputs the combined signal to the plurality of feeds 31, the ratio of the number Nw of phase-adjusted signals to the combined signal is Nw:1. That is, each of the plurality of combiners 14 receives and combines the number Nc of phase-adjusted signals to output a single excited signal.

As described above, in the present invention, it is possible that the BFN 10 has only the number Nb * Nc of variable attenuators 12 and variable phase shifters 13 because the phase array antenna system in accordance with the present invention does not recompose beams according to communication service conditions. The conventional phase array antenna systems are required to recompose beams frequently according to communication service conditions, and for this, signals need to be transferred to various combination of feeds 31. That is, all possible combinations of the plurality of feeds 31 for each of all possible combinations of the plurality of signals are required. Accordingly, the conventional phase array antenna system illustrated in FIG. 1 requires the number Nb*Ne of variable phase shifters. That is, each of the number Nb of BFNs requires the number Ne of variable phase shifters. If the number of feeds 31 is thirty two and the number of signals to be outputted as a beam is eight, then the phase array antenna system of FIG. 2 requires 256 (=8*32) variable phase shifters, whereas the phase array antenna system of the present invention requires 56 (=8*7) variable phase shifters since it is assumed that seven feeds 31 form a single beam, thereby greatly reducing the number of variable phase shifters. Although the phase array antenna system of FIG. 2 does not use variable phase shifters due to using phase optimization (PO), since the number of required variable attenuators for a phase array antenna system using amplitude & phase optimization (A&P) or amplitude optimization (AO) is the same as the number of variable phase shifters, the phase array antenna system in accordance with the present invention can also reduce the number of variable attenuators 12 greatly.

In addition, each of the plurality of dividers 11 of the present invention can be provided with one input port and the number Nc of output ports (7 output ports in FIG. 3) because the number of feeds 31 corresponding to signals is fixed, and similarly each of the plurality of combiners 14 can be provided with the number Nc of input ports and one output port. Compared to the conventional phase array antenna system including the divider having the number Ne of output ports (32 output ports in FIG. 3) and the combiner having the number Ne of input ports for enabling various combinations of the signals and feeds, it becomes possible to realize the dividers 11 and the combiners 14 through greatly reducing the number of ports.

Unlike the phase array antenna system of FIG. 1 provided with one MPA, the phase array antenna system of FIG. 3, is provided with an MPA set 20 having a plurality of MPAs 21, each of which receives corresponding signals that are combined by the plurality of combiners 14 and controls output powers to excite the corresponding feed among the plurality of feeds 31 of the feed array 30. Each of the plurality of MPAs is constituted with N×N MPAs 21 having N input ports and N output ports. In the present invention, the number of input ports and the number of output ports for each of the plurality of MPAs 21 are each assumed to be four. The number of the plurality of MPAs 21 is determined in accordance with the number of the feeds 31 and the number of output ports of the MPAs 21. In FIG. 3, the number of the feeds 31 is thirty two, and the number of output ports of the MPAs 21 is four, and thus the MPA set 20 has eight (=32/4) MPAs.

The feed array 30 having a plurality of feeds 31 emits a beam by being excited according to an output power inputted from the corresponding MPA among the plurality of MPAs 21 in the MPA set 20.

As described above, in the phase array antenna system of the present invention, one BFN 10 divides each of a plurality of signals B1~BNb to Nc signals, combines Nw excited signals that are generated from the divided signals by adjusting the amplitude and phase, and transfers the phase adjusted signals as well as the divided signals to the MPA set 20. The MPA set 20 is provided with the plurality of MPAs 21 corresponding to the number Ne of feeds 31 and the number of output ports, and excites the feeds by receiving the excited signals and amplifying them in accordance with communication traffic.

Figure 4:
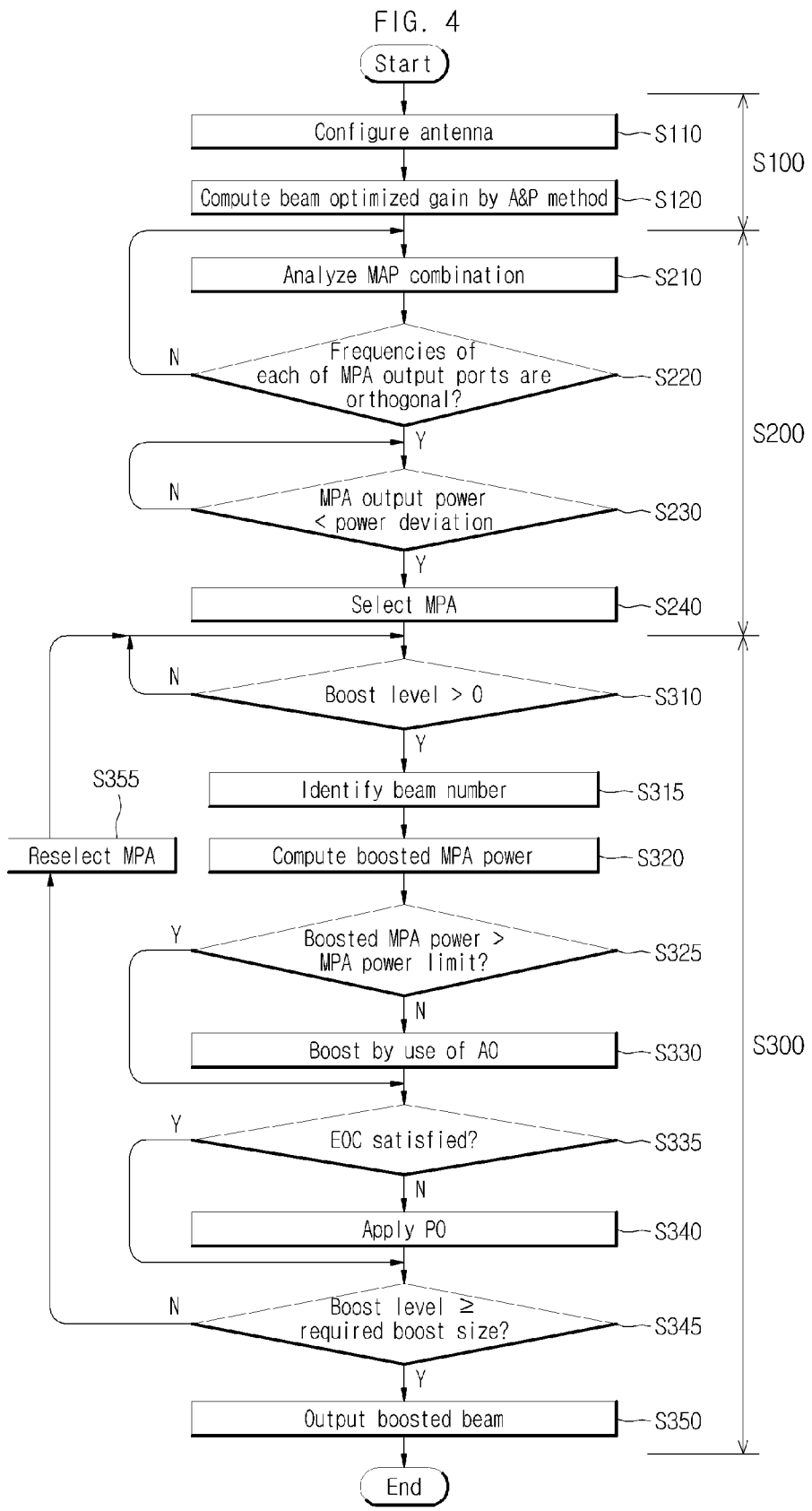
FIG. 4 is a flowchart showing an example of a method for controlling an output power by the phase array antenna system shown in FIG. 3.

FIG. 4 is a flowchart showing an example of a method for controlling an output power by a phase array antenna system.

Describing the method for controlling an output power by a phase array antenna system shown in FIG. 4 with reference to FIG. 3, the method of controlling an output power is constituted with three steps. A first step S100 is designing a multi-beam for a normal condition that does not require a boosted beam, and a second step S200 is optimizing a connection between a plurality of MPAs 21 and a plurality of feeds 31 based on the multi-beam designed in the first step, and a third step S300 designing a boosted beam having the enforced output in a boost condition when a surge of communication traffic or an increased signal attenuation due to precipitation occurs in a certain service coverage.

In the first step S100 of designing a multi-beam for a normal condition, an antenna is configured (S110). Since the antenna is a kind of hardware and thus is difficult to be modified once it is configured, a configuration of the antenna needs to be predetermined. When the antenna is configured, an EOC gain of each beams is optimized S120 by use of A&P for an excited signal and a phase of the plurality of feeds 31 according to the determined antenna configuration. In the process of optimizing the EOC gain of each beam, feeds 31 that contribute to forming the beam are selected, and a required power for the individual feed is determined.

A required power for a beam ($P_{beam}$) is computed in order to determine the required powers for the individual feeds. The required power $P_{beam}$ can be computed as shown in Equation 1, with the required effective isotropically radiated power (EIRP) and an optimized antenna EOC gain ($G_{EOC}$).

$$P_{beam}[dBW] = EIRP_{beam}[dBW] - G_{EOC}[dB] \quad \text{[Equation 1]}$$

The power required for the individual feed is an output power of a high power amplifier ($P_{HPA}$) in an MPA, and it is computed as shown in Equation 2, with an amplitude of excited signal ($A_{exi}$) of each feed in a feed cluster to form a single beam, and the required power for a beam $P_{beam}$. Here, the unit for the high power amplifier and each beam is W.

$$P_{HPA} = \sum_{i=1}^{Nc} \{P_{beam} X A_{exi}(i)\} \quad \text{[Equation 2]}$$

Once designing a beam in a normal condition is finished, implementable MPA combinations are analyzed (S210) in the second step S200 of optimizing connections between a plurality of MPAs 21 and a plurality of feeds 31. Then, it is determined whether frequencies of output ports of the plurality of MPAs for each of the analyzed MPA combinations cross orthogonally with one another (S220). That is, each of the feeds selected to form a single beam needs to be connected to a different MPA among the plurality of MPAs 21 of the MPA set 20. This increases a freedom to design optimizing excitation coefficients, thus allowing A&P to be applied and an antenna gain to be optimized.

If the frequencies of the output ports are determined to be orthogonal to each other, it is determined whether the output power of the individual MPA ($P_{MPA}$) is within a required power deviation ($P_{dev}$) (S230). The output power of N×N MPA is the same as the sum of N high power amplifiers in the MPA. Therefore, if powers of each individual MPA are similar, the high power amplifier in the MPA can be configured as $P_{MPA}/N$ (W) in common, and thus it becomes possible to operate power efficiency and DC power consumption effectively.

If there is an MPA combination in which the $P_{MPA}$ is determined to be within $P_{dev}$ is, the MPA combination is selected by determining that the connection between the plurality of MPAs 21 and the plurality of feeds 31 is the optimized combination (S240).

Describing detailed steps of the second step S200 of optimizing the connection between the plurality of MPAs 21 and the plurality of feeds 31, in the step S210 of analyzing the possible MPA combinations, the MPA combinations are expressed in the form of a matrix. If MPA(m), which is the $m^{th}$ MPA, is expressed in a matrix format, the matrix size can be represented as N×(Nw+2). Here, each row of the matrix corresponds to the output ports of the MPA. The first column of the matrix corresponds to the feeds to be connected to the output ports of the MPA and can be represented as feed numbers $E_1 \sim E_{Ne}$. Because the MPA has N output ports, the N number of the feed numbers corresponding to feeds to be put in the MPA matrix are selected among the feed numbers $E_1 \sim E_{Ne}$ and are put in the first column of the matrix. Since N feeds to be connected to the output ports are selected among Ne feeds of the MPA matrix, the number of combinations of MPA matrix can be computed to be $_{Ne}C_N$.

The second to (Nw+2)th columns of the MPA matrix represent characteristics of the feeds, and the second to (Nw+1)th columns represent frequencies in which the selected feeds are involved, and the (Nw+2)th column represents a required power for the selected feed. The frequencies in which the feeds are involved and the required powers are computed in advance in the first step of designing a multi-beam. The frequencies in which the feeds are involved are represented as $F_1 \sim F_{Nb}$ from the second to (Nw+1)th columns Here, the number of beams in which the feeds are involved is the same as or less than the number Nw of beams to which one feed can contribute. Moreover, the (Nw+2)th column represents required power W for individual feeds computed with Equation 2.

An example of a matrix for the plurality of MPAs 21 of the MPA set 20 in FIG. 3 is represented by Equation 3.

$$MPA(m) = \begin{bmatrix} E_1 & F_5 & F_0 & F_0 & 0.58 \\ E_{13} & F_6 & F_7 & F_8 & 7.78 \\ E_{16} & F_1 & F_2 & F_3 & 6.73 \\ E_{18} & F_3 & F_4 & F_5 & 12.19 \end{bmatrix}, \quad \text{[Equation 3]}$$

$$m = 1 \text{ to } _{32}C_4$$

Since 4×4 MPA of FIG. 3 is connected with four feeds, the number of possible combinations of the MPA matrix is the same as a combination in which four feeds are randomly selected among 32 feeds without duplication. The number of cases is $_{32}C_4$, that is, 35,960.

If the possible MPA is represented by a matrix form, the step S220 of determining whether frequencies of each output ports of the plurality of MPAs are independently orthogonal to each other can be performed by a redundancy check for the frequencies in each of the matrix for the plurality of MPAs. Namely, identical frequencies in the $2^{nd}$ column to $4^{th}$ column of the matrix in Equation 3 can be checked. In Equation 3, the two frequencies $F_3$ and $F_6$ are duplicated so they are not orthogonal.

The MPA matrix in Equation 4 shows an example of a connection between MPA output ports and feeds having frequency orthogonality.

$$MPA(m) = \begin{bmatrix} E_1 & F_5 & F_0 & F_0 & 0.58 \\ E_{13} & F_6 & F_7 & F_8 & 7.78 \\ E_{16} & F_1 & F_2 & F_3 & 6.73 \\ E_{31} & F_4 & F_0 & F_0 & 0.91 \end{bmatrix},$$ [Equation 4]

$m = 1$ to $4,617$

The number of MPA matrixes having frequency orthogonality among 35,960 MPA matrixes is 4,617. Here, the numbers of $5^{th}$ column are required powers for individual feeds (PHPA), and their sum 19.93 W (=0.58+7.78+6.73+ 0.91) is an output power of the individual MPA ($P_{MPA}$).

If there are no duplicated frequencies in the MPA(m), the MPA(m) can be determined to have frequency orthogonality. Here, since the number of beams that the feeds contribute to forming is less than Nw, there can be cases where there are no corresponding frequencies. The case where there is no corresponding frequency is represented as F0, and it will be excluded from the redundancy check in the step S220, which determines whether frequencies of the output ports of the plurality of MPAs are orthogonal to each other.

In the step S230 of determining whether $P_{MPA}$ is within $P_{dev}$, if the $P_{MPA}$ equal to $P_{tot}$/Ne×N, all MPA powers are the same, and $P_{HPA}$ is also required so it is determined that power efficiency and DC power consumption can be optimized. Namely, it is determined whether $P_{MPA}$ is within $P_{dev}$. Here, $P_{tot}$ is a sum of powers of individual feeds. An MPA that allows $P_{dev}$ (e.g. 2%) to satisfy Equation 5 is determined $$\frac{P_{tot} \times N}{N_e} \times \left(1 - \frac{P_{dev}}{100}\right) < P_{MPA}(m) < \frac{P_{tot} \times N}{N_e} \times \left(1 + \frac{P_{dev}}{100}\right)$$ [Equation 5]

If an average power of an individual MPA of a phase array antenna system in FIG. 3 is 21.5 W (=$P_{tot}$/Ne×N), the number of MPA satisfying Equation 5 for 2% of $P_{dev}$ is 214.

Accordingly, an MPA combination satisfying the step S220 of determining whether frequencies of each output ports of the plurality of MPAs cross one another orthogonally and the step S230 of determining whether the output power $P_{MPA}$ of the individual MPA is within the $P_{dev}$ is selected (S240). That is, matrixes of MPA in which frequencies of output ports are orthogonal to each other and $P_{MPA}$ is within $P_{dev}$ are selected among the number $_{Ne}C_N$ of MPA combinations represented in the form of matrix, thereby producing the MPA satisfying A&P. Here, the required number of selected MPA ($N_{MPA}$) needs to be greater than or equal to the number Nc of feeds required for forming a single beam (e.g., 7 in FIG. 3), and needs to be greater than or equal to Ne/N to compose the MPA set 20 (e.g., 9 in FIG. 3). In FIG. 3, the MPA set 20 has the minimum number of eight MPAs 21, which is the same as that of Ne/N.

In addition, the plurality of MPAs 21 in the MPA set 20 need to be configured in such a way that the feeds are not redundant with one another. There can be 3 possible MPA combinations calculated for eight MPAs that satisfy the above conditions and have no overlapped connection between thirty two output ports and thirty two feeds. That is, the phase array antenna system of the present invention can be composed by selecting one of the three MPA combinations. Here, the number of MPA combinations can vary in accordance with $P_{dev}$.

Figure 5:
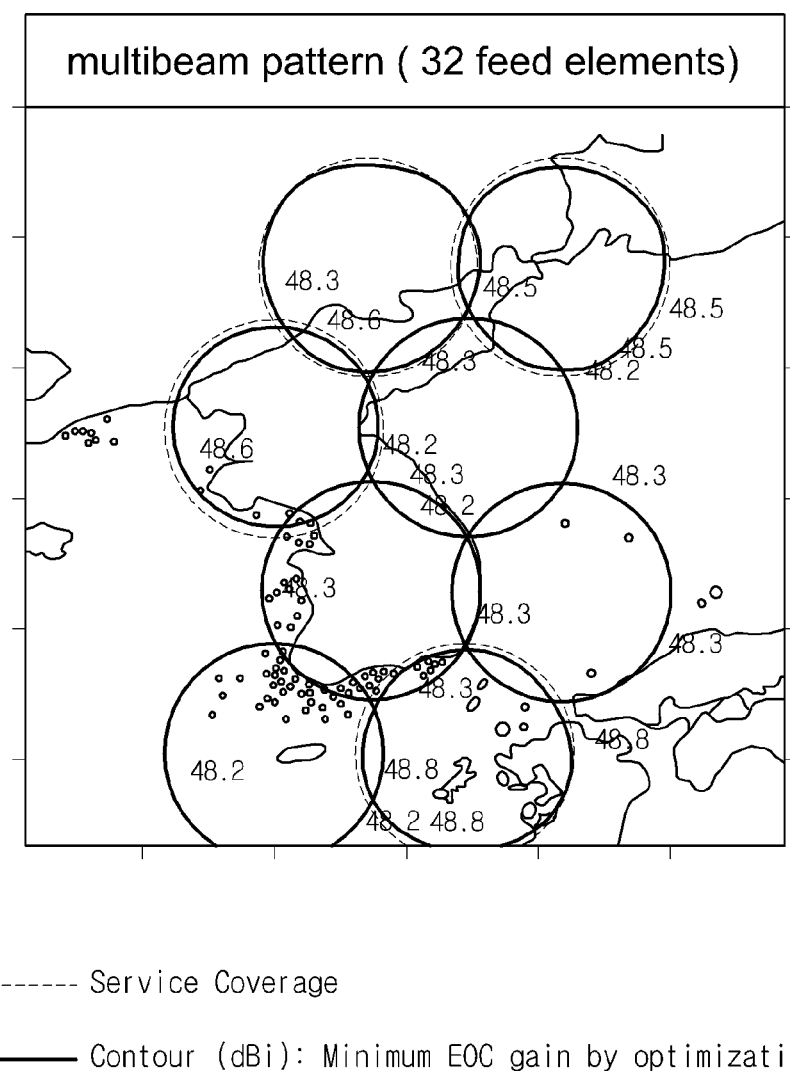
FIG. 5 shows beam patterns and EOC gains by use of the phase array antenna system in accordance with the present invention.
Figure 6:
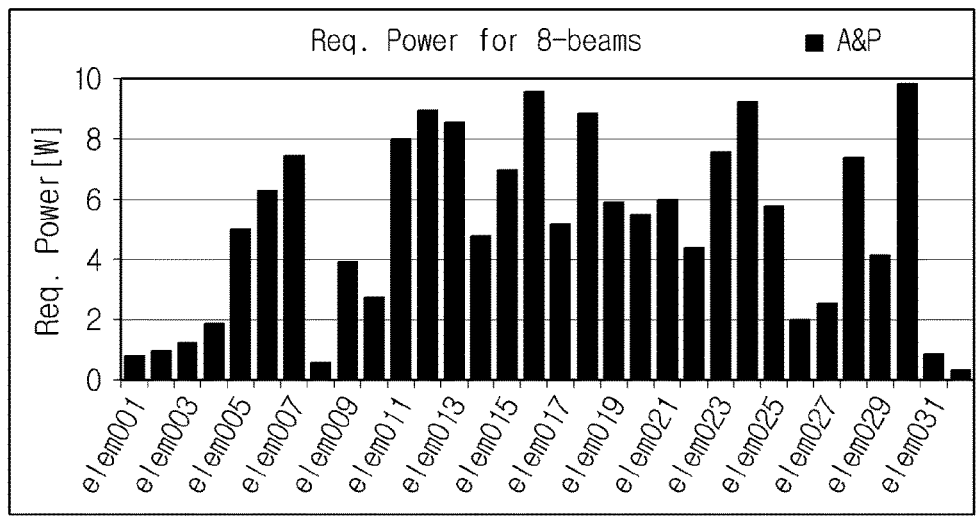
FIG. 6 illustrates required powers for each of a plurality of feeds of the phase array antenna system in accordance with the present invention.

FIG. 5 shows beam patterns and an EOC gains by use of the phase array antenna system in accordance with the present invention, and FIG. 6 illustrates required powers for each of a plurality of feeds of the phase array antenna system in accordance with the present invention.

Illustrated in FIG. 5 and FIG. 6 are beam patterns, EOC gains, and required powers for each of a plurality of feeds for the phase array antenna system.

As illustrated in FIG. 5, it is assumed that multi-beam service coverage consists of eight beams (Nb=8), that a required EIRP for an individual beam in normal condition is 59 dBW, and that 4×4 MPAs (N=4) are used. An antenna operating in Ka band is designed to have a 2.8 m reflector and thirty two feeds (Ne=32). A multi-beam designed by A&P has six to seven feeds involved, and $P_{tot}$ is 172 W.

Due to A&P performed, the range of power for the individual feed is wide, thereby decreasing a system efficiency and increasing implementation costs. Here, excitation coefficients can be recombined using the MPA.

Again, describing the method for controlling an output power of a phase array antenna system shown in FIG. 4, in the step of designing a boosted beam (S300), in order to provide a seamless communication service, a boost level per beam indicating to which level each beam needs to be boosted is inputted, and it is determined whether the boost level exceeds 0 dB (S310).

If the boost level is equal to or greater than 0 dB, beam numbers of which the boost level exceeds 0 dB are identified (S315). Here, it is assumed that the boost level is 3 dB and the beam number to be boosted is six. Moreover, a boosted MPA power for an individual MPA that is required to boost a beam for a certain service coverage up to the boost level is computed (S320). The required power for the feeds forming a beam for the service coverage needs to be increased, and this affects the MPA power. Accordingly, in order to boost a beam, the boosted MPA power is computed in advance. Once the boosted MPA power is computed, it is determined whether the boosted MPA power exceeds an MPA power limit (S325). In order to increase the MPA power, the output power of a high power amplifier in the MPA needs to be increased. However, a high power amplifier having a high output power requires high development costs and a high DC power consumption. Moreover, when the output power of the high power amplifier is increased, performances of the high power amplifier are not fully utilized in a normal condition that does not require the boosted beam. In order to avoid these drawbacks, an MPA output power is frequently restricted by deciding the MPA output power as a required power for the normal condition. If the boosted MPA power exceeds the MPA power limit, the beam may not be boosted.

Therefore, the required power for an individual MPA should not exceed the MPA power limit in order to form the boosted beam. However, if the boosted MPA power does not exceed the MPA power limit, an output power of the high power amplifier can be increased, so the beam is boosted by use of AO (S330). Here, excitation coefficients are fixed without being changed in order to maintain the multi-beam patterns and performances.

The ratio of $P_{tot}$ to a total power for a case having the boosted beam ($P_{boost}$) is a power usage efficiency ($P_{eff}$ (%)) and can be computed as shown in Equation 6.

$$P_{eff} = P_{boost}/P_{tot} \times 100$$ [Equation 6]

If the beam is boosted by use of AO for an excited signal, the power usage efficiency is increased as the usage power of an MPA becomes close to the MPA power limit.

However, an amplitude of the excited signal changed by AO can deteriorate antenna patterns and gain performances.

Accordingly, the EOC gain is recomputed and is determined whether it satisfies a required gain (S335). If the EOC gain is satisfied, only AO is applied. However, if the EOC gain is not satisfied, PO is applied to increase the EOC gain (S340). Afterwards, it is determined whether the boost level of the beam is equal to or greater than the required boost level (S345). If the boost level of the beam is equal to or greater than the required boost level, the phase array antenna system outputs the boosted beam (S350).

If the boost level of the beam is less than the required boost level, an MPA combination is reselected since the presently selected MPA combination cannot provide the required boost level (S355). Here, in the reselected MPA combination, frequencies of each port are orthogonal to each other, and $P_{MPA}$ is determined to be within $P_{dev}$ (refer to step S230). Then, the step S300 of designing a boosted beam is performed by use of the reselected MPA, thereby allowing the boosted beam to be outputted.

Figure 7:
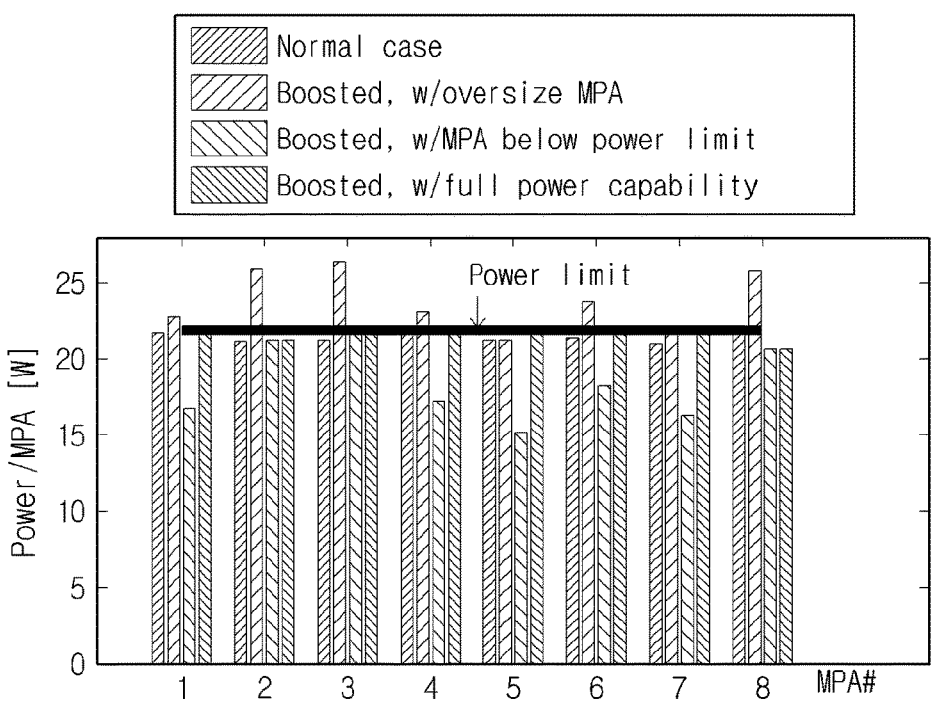
FIG. 7 illustrates required MPA powers for forming a boosted beam for the phase array antenna system in accordance with the present invention.

As a result, as indicated by "Boosted, w/full power capability" in FIG. 7, the MPA powers can be nearly fully utilized.

Although it is not illustrated, in case the boosted beam cannot be provided with required level even though the step S300 of designing a boosted beam is performed for all selectable MPAs, the step S300 of designing a boosted beam can be performed again after obtaining a new MPA combination by increasing $P_{dev}$.

That is, the phase array antenna system of the present invention can perform A&P at an initial stage for service, and then use AO only or use AO and PO to provide the boosted beam when the boost beam is required. This allows the beam to be boosted without recomposing the beam shape, thereby simplifying the structure of the phase array antenna system and enhancing resource efficiency.

In conventional technologies, PO is used more often than A&P due to the problem of high power amplifier. However, as illustrated in FIG. 3, the present invention is able to apply all optimization techniques (A&P, AO, PO) by increasing the freedom for designing excitation coefficients, compared to the conventional technologies, through allowing the number of MPA to be 8, which is equal to or greater than that of Ne/N and Nc.

FIG. 7 illustrates required MPA powers for forming the boosted beam for the phase array antenna system in accordance with the present invention.

In FIG. 7, "Normal Case" denotes an individual MPA power required in a normal condition, and "Boosted, w/oversize MPA" denotes a case when an individual MPA power required for forming the boosted beam exceeds the MPA power limit. Moreover, "Boosted, w/MPA below power limit" denotes a case where an individual MPA power required for forming the boosted beam does not exceed the MPA power limit.

If the boosted MPA power does not exceed the MPA power limit, like the "Boosted, w/MPA below power limit" of FIG. 7, the MPA satisfying a power limit condition deteriorates an EIRP performance, thereby causing an aEIRP (aggregated EIRP) loss. Under the above assumption, the aEIRP of the phase array antenna system in a normal condition is 68 dBW (=59 dBW+10*log 10 (Nb)), and an MPA not exceeding the power limit can be realized, in the case of the boosted beam, when the aEIRP loss is 4.8 dB. The aEIRP loss decreases power efficiency of the Equation 6 because excitation coefficients are not changed for maintaining multi-beam patterns and gain performances. The 4.8 dB aEIRP loss results in 85% power usage efficiency. In other words, 15% power is wasted. The present invention performs AO for an excited signal for preventing resource waste and for minimizing deterioration of beam patterns and gain performances. Accordingly, up to 100% power efficiency is possibly designed, and the result thereof is illustrated with brown bars (Boosted, w/full power capability) in the graph of FIG. 7.

In the antenna performance deteriorated by the change in amplitude of the excited signal, the phase of the excited signal is only improved through PO, and power efficiency can be allowed to be maintained in its optimal state.

FIG. 8a~FIG. 8d are graphs showing simulation results of beam boost performances of the phase array antenna system in accordance with the present invention.

Figure 8A:
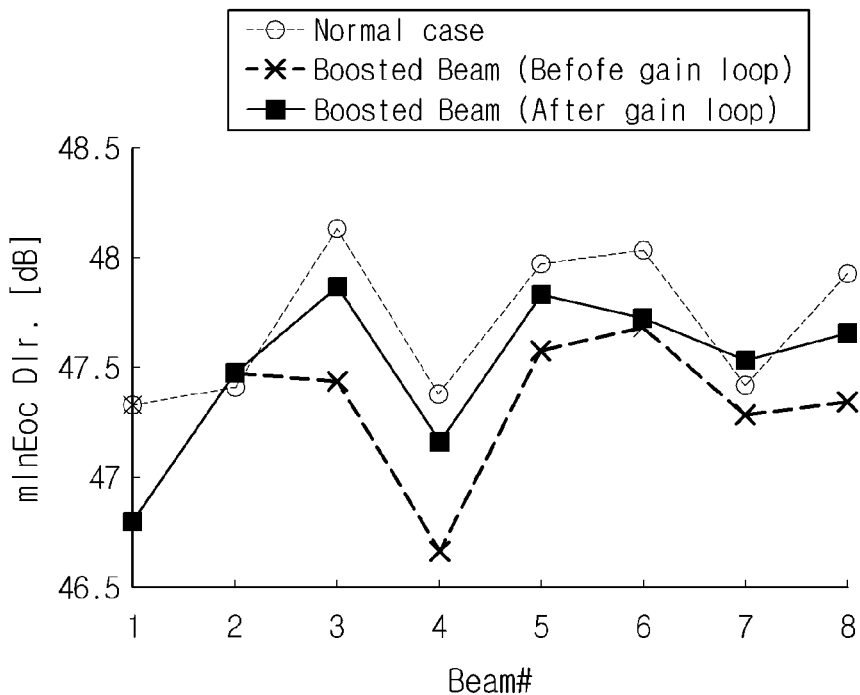
FIG. 8a is a graph showing minimum directivity in an EOC for an individual beam for the phase array antenna system in accordance with the present invention.
Figure 8B:
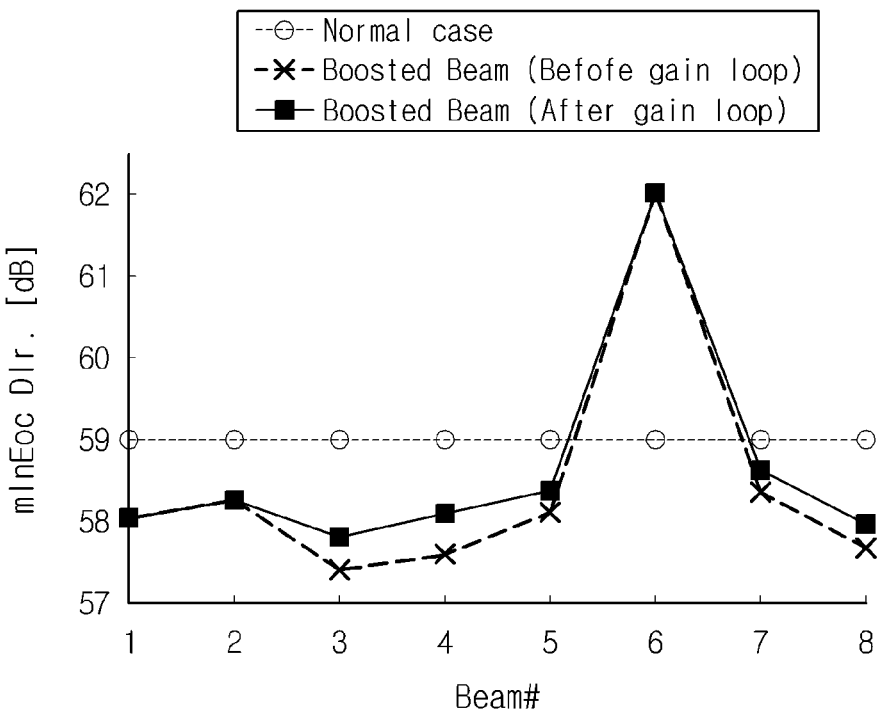
FIG. 8b is a graph showing minimum EIRP in an EOC for an individual beam for the phase array antenna system in accordance with the present invention.
Figure 8C:
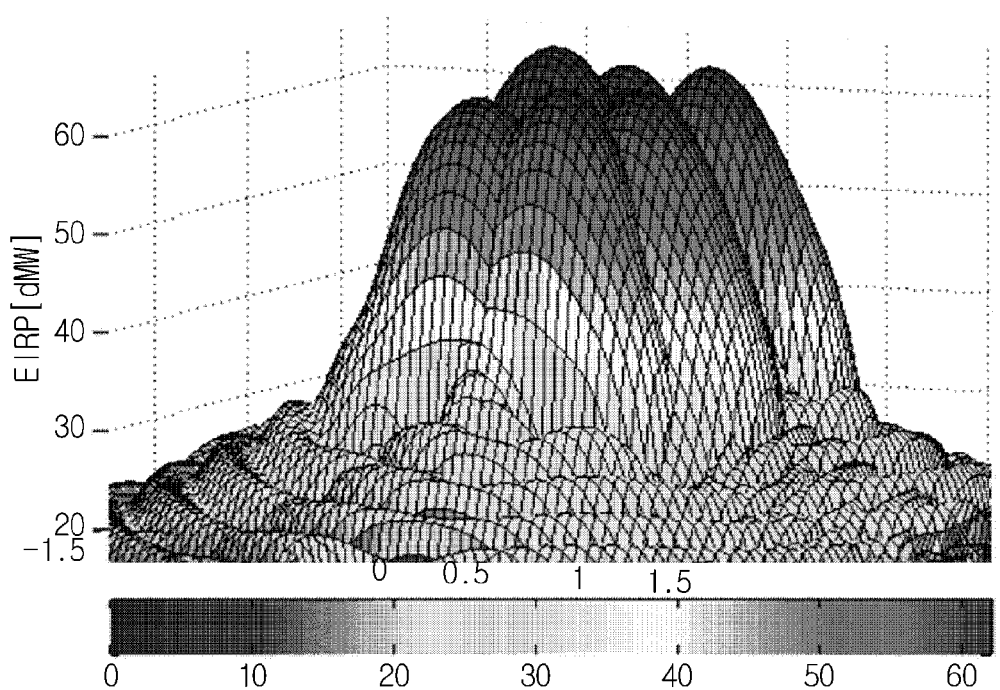
FIG. 8c is a graph showing EIRP 3-dimensional patterns for a multi-beam having the boosted beam for the phase array antenna system in accordance with the present invention.
Figure 8D:
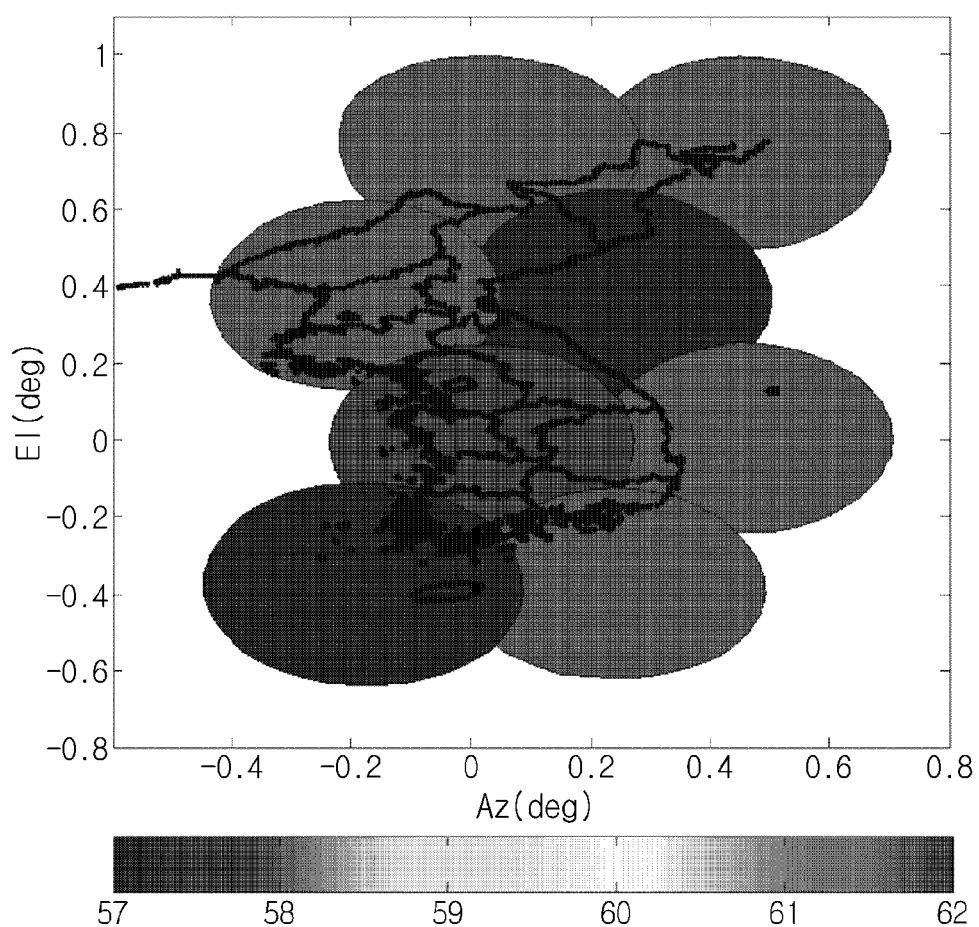
FIG. 8d is a graph showing two-dimensional outlines for a multi-beam having the boosted beam for the phase array antenna system in accordance with the present invention.

FIG. 8a shows minimum directivity of an individual beam in an EOC, and FIG. 8b shows minimum EIRP of an individual beam in an EOC. FIG. 8c and FIG. 8d denote, respectively, EIRP three-dimensional patterns for a multi-beam having the boosted beam and two-dimensional outlines of a multi-beam having the boosted beam.

As shown in FIG. 8c and FIG. 8d, it is verified that the EIRP of the beam in service coverage no. 6 is boosted by 3 dB to 62 dBW.

In the present invention, it is possible to increases the freedom of designing excitation coefficients through an optimized connection between MPA output ports and feeds, and through this, step-by-step optimization, such as amplitude & phase optimization (A&P), amplitude optimization (AO), and phase optimization (PO), can be performed. As a result, the phase array antenna system in accordance with the present invention can have, for example, 59 dBW EIRP and 68 dBW aEIRP in a normal condition, and 62 dBW ERIP for the no. 6 service coverage and 57.8 dBW EIRP or greater for the rest of the service coverage for a case requiring a 3 dB boost, and thus the aEIRP becomes 67.9 dBW. That is, the system can be implemented without resource waste by having 100% power usage efficiency with only 0.1 dB aEIRP loss.

The method in accordance with the present invention can be realized by computer program stored in computer-readable media. The computer-readable media can include any kinds of recording media, such as ROM, RAM, CD-ROM, magnetic tape, floppy disk, optical recording media and carrier wave media (e.g., transmission through the Internet). Also, the computer-readable media can store computer readable codes in the systems connected with divided network and allow the computer to read and run the codes in divided method.

While the present invention has been described with reference to certain embodiments, the embodiments are for illustrative purposes only and shall not limit the present invention. It is to be appreciated that various permutations and modifications of the present invention are possible by those skilled in the art without departing from the original intention of the invention, which shall be defined by the claims appended below. The protected scope of the present invention shall be understood by the scope of claims below, and all technical ideas residing in the scope of claims shall be included in the rights of the present invention.

What is claimed is:

1. A phase array antenna system, comprising:
   a beam forming network configured to receive a plurality of signals to be a plurality of beams, to divide each of the plurality of signals to a plurality of divided signals, and to output a plurality of excited signals by adjusting and combining amplitude and phase of each of the plurality of divided signals;

the beam forming network further comprising:
　a plurality of dividers;
　a plurality of variable attenuators;
　a plurality of variable phase shifters;
　a plurality of combiners configured to each receive the plurality of divided signals from the variable phase shifters and each output a single excited signal;
an MPA set having a plurality of MPAs configured to receive corresponding excited signals among the plurality of excited signals from the beam forming network and to control output powers of the received excited signals according to communication traffic; and
a feed array having a plurality of feeds configured to form a multi-beam by being excited according to the amplitude and phase of the excited signals from the MPA set,
wherein the plurality of variable phase shifters directly transfers at least one phase adjusted signal to the MPA set.

2. The system of claim 1, wherein the beam forming network comprises:
　a plurality of dividers provided in a quantity corresponding to the number of the plurality of beams, wherein each divider is configured to receive corresponding input signal among the plurality of input signals and to divide the input signal in accordance with the number of Nc feeds required for forming a single beam;
　a plurality of variable attenuators configured to receive corresponding divided signals among the plurality of divided signals from the plurality of dividers and to adjust an amplitude of the divided signals;
　a plurality of variable phase shifters provided in a quantity corresponding to the number of the plurality of variable attenuators and configured to adjust phases of the amplitude-adjusted signals from corresponding variable attenuators among the plurality of variable attenuators; and
　a plurality of combiners provided in a quantity corresponding to the number of the plurality of feeds and configured to receive and combine the number Nw of amplitude and phase adjusted signals among the plurality of amplitude and phase adjusted signals from the plurality of variable phase shifters and to output the excited signals, wherein Nw is the number of beams that one feed can contribute to beam-forming.

3. The system of claim 2, wherein the beam forming network comprises the number Nb of dividers, wherein the beam forming network comprises the plurality of variable attenuators and the plurality of variable phase shifter provided in quantity of Nb * Nc, wherein Nb is the number of the input signals and Nc is the number of the feeds required for forming a single beam.

4. The system of claim 1, wherein the MPA set comprises the plurality of MPAs, each MPA of the plurality of MPAs having an N number of input ports and an N number of output ports, wherein the number of the plurality of MPAs is the greater of Nc and Ne/N, wherein Nc is the number of the feeds required for forming a single beam and Ne is the number of feeds.

5. The system of claim 4, wherein at least one of the output ports of each MPA of the plurality of MPAs is configured to be connected to the plurality of feeds according to an amplitude & phase optimization (A&P) in a normal condition, not requiring a boosted beam.

6. The system of claim 5, wherein in the connection of the plurality of MPAs and the plurality of feeds, the feeds selected for forming a single beam are each connected with different MPAs among the plurality of MPAs so that frequencies of the output ports of the plurality of MPAs are orthogonal with each other.

7. The system of claim 5, wherein in the connection of the plurality of MPAs and the plurality of feeds, output power of each of the plurality of MPAs is configured to be within a predetermined power deviation.

8. The system of claim 5, wherein, in a boost condition, the MPA set is configured to identify a boost level, to identify a beam which needs to be boosted among the plurality of beams, to compute a boost MPA power for each of the plurality of MPAs required for boosting the beam to the boost level, and to control the output powers of the plurality of MPAs according to an amplitude optimization (AO) if the computed boost MPA power does not exceed an MPA power limit.

9. The system of claim 5, wherein the MPA set is configured to determine whether an EOC (Edge Of Coverage) gain generated by output powers of the plurality of MPAs controlled according to an amplitude optimization (AO) satisfies a required EOC gain, and to increase the EOC gain by applying phase optimization (PO) if the required EOC gain is not satisfied.

10. The system of claim 5, wherein the MPA set is configured to connect the output ports of the plurality of MPAs and the plurality of feeds through a different connection if the computed boost MPA power exceeds the MPA power limit in the boost condition, and then to control the output powers of the plurality of MPAs according to an amplitude optimization (AO).

\* \* \* \* \*